United States Patent
Kim

(10) Patent No.: US 6,461,941 B2
(45) Date of Patent: Oct. 8, 2002

(54) METHOD OF FORMING CAPACITOR ON CELL REGION INCLUDING FORMING DUMMY PATTERN AROUND ALIGNMENT KEY

(75) Inventor: Young-Ki Kim, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/867,861

(22) Filed: May 31, 2001

(65) Prior Publication Data

US 2002/0019091 A1 Feb. 14, 2002

(30) Foreign Application Priority Data

May 31, 2000 (KR) .................................... 2000-29678

(51) Int. Cl.[7] .................. H01L 21/301; H01L 21/46; H01L 21/78
(52) U.S. Cl. .................. 438/462; 438/393; 438/926; 438/975
(58) Field of Search .................. 438/393, 462, 438/926, 975

(56) References Cited

U.S. PATENT DOCUMENTS 6,087,733 A * 7/2000 Maxim et al. .......... 438/401 X
6,261,918 B1 * 7/2001 So ............................ 438/401
6,335,560 B1 * 1/2002 Takeuchi .................... 257/620
6,373,544 B1 * 4/2002 Hirabayashi ............... 349/149
2001/0039086 A1 * 11/2001 Sato ........................... 438/241

FOREIGN PATENT DOCUMENTS

JP    2000208392 A  *  7/2000

* cited by examiner

Primary Examiner—Matthew Smith
Assistant Examiner—Craig P. Lytle
(74) Attorney, Agent, or Firm—Jacobson Holman, PLLC

(57) ABSTRACT

A method for the fabrication of a semiconductor device which prevents the occurrence of a defective die and an erroneous alignment otherwise invoked by a difference in polishing level between an edge and a central portion of a wafer. The method comprises steps of forming a group of dummy patterns around an alignment key of edges of a wafer, wherein the wafer is obtained by forming the capacitor on the cell region, and the dummy pattern has the same elevation as the capacitor formed on the cell region; disposing an interlayer insulating film on a resulting structure obtained after the forming process; and performing a chemical-mechanical polishing on the interlayer insulating film. Further, the process of forming the group of dummy patterns may be performed while forming the capacitor on the cell region.

6 Claims, 4 Drawing Sheets

PAK

DUM

METHOD OF FORMING CAPACITOR ON CELL REGION INCLUDING FORMING DUMMY PATTERN AROUND ALIGNMENT KEY

FIELD OF THE INVENTION

The present invention relates to a semiconductor device and, more particularly, to a method for the fabrication of a semiconductor device which is capable of preventing the occurrence of a defective die and misalignment otherwise induced by excessively polishing the edges of a wafer.

DESCRIPTION OF THE PRIOR ART

In fabrication processes of semiconductor devices with high-integration density such as 256M synchronous DRAM, an increased number of chemical-mechanical polishing (CMP) processes are applied. That is, a first CMP process involves polishing a high-density plasma oxide (HDP) in the formation of shallow trench isolation (STI) for providing electrical isolation between elements. A second CMP process involves polishing an interlayer insulating film covering a gate electrode. A third CMP process involves polishing a plug polysilicon film connected to the gate electrode via a contact hall formed within the interlayer insulating film. A fourth CMP process involves polishing an interlayer insulating film covering a bitline. A fifth CMP process involves subjecting an interlayer insulating film covering a capacitor to planarization.

Since an edge portion of the wafer has a lower pattern concentration relative to a central portion thereof, the edge portion may be subjected to an excessive CMP process.

There is shown in FIG. 1 a layout of a die and alignment key on the wafer in the conventional fabrication process of a semiconductor device. As shown in FIG. 1, when an interlayer insulating film (not shown), which covers the wafer W obtained after forming a capacitor, is polished by the CMP process, a considerable difference in polishing level between the central portion and the edge portion of the wafer may be invoked, wherein a pattern including the capacitor is concentrated at the central portion of the wafer.

Accordingly, since a pattern collapse or a bridge may occur during a subsequent masking process, a die D1 positioned at the edge of the wafer may not be employed as a final net die. The result is a decreased number of net dies on the wafer W. That is, the number of net dies during the formation of the capacitor is 148, but the number is decreased to 128 due to the unreasonable CMP process. As mentioned above, the conventional method suffers from a drawback in that the application of the excessive CMP process to the wafer edge allows the die D1 positioned at the edge portion of the wafer to be damaged, causing a "dishing", namely a dish-like depression on the surface of a pre-alignment key (PAK) and a global alignment key (GAK), which, in turn, makes alignment in a subsequent metal pattern process difficult.

SUMMARY OF THE INVENTION

It is, therefore, a primary object of the present invention to provide a method for the fabrication of a semiconductor device which is capable of preventing a defective die and an erroneous alignment which might otherwise be induced by a difference in polishing level between an edge and a central portion of a wafer.

In accordance with one aspect of the present invention, there is provided a method for the fabrication of a semiconductor device having a cell region on which a capacitor is formed, comprising steps of forming a group of dummy patterns around an alignment key of edges of a wafer, wherein the wafer is obtained by forming the capacitor on the cell region, and the dummy pattern has the same elevation as the capacitor formed on the cell region; disposing an interlayer insulating film on a resulting structure obtained after the forming step; and performing a chemical-mechanical polishing on the interlayer insulating film.

In accordance with another aspect of the present invention, there is provided a method for the fabrication of a semiconductor device having a cell region on which a capacitor is formed, comprising steps of forming a group of dummy patterns around an alignment key of edges of a wafer, while forming the capacitor on the cell region, wherein the dummy patterns have the same elevation as the capacitor formed on the cell region; disposing an interlayer insulating film on a resulting structure obtained after the forming step; and performing a chemical-mechanical polishing on the interlayer insulating film.

According to the present invention, a group of dummy patterns is formed around a die and alignment key of edges of a wafer in a bar shape, to thereby decrease a difference in pattern concentration between a central and an edge portion of the wafer. Furthermore, the present invention decentralizes a pad pressure using the dummy pattern during polishing processes to allow the pad pressure to be applied to the dummy pattern, thereby preventing an excessive CMP from being applied to dies placed adjacent to the edge of the wafer and preventing a dishing of the alignment key, resulting in an increased net die, improved accuracy and reduced misalignment.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
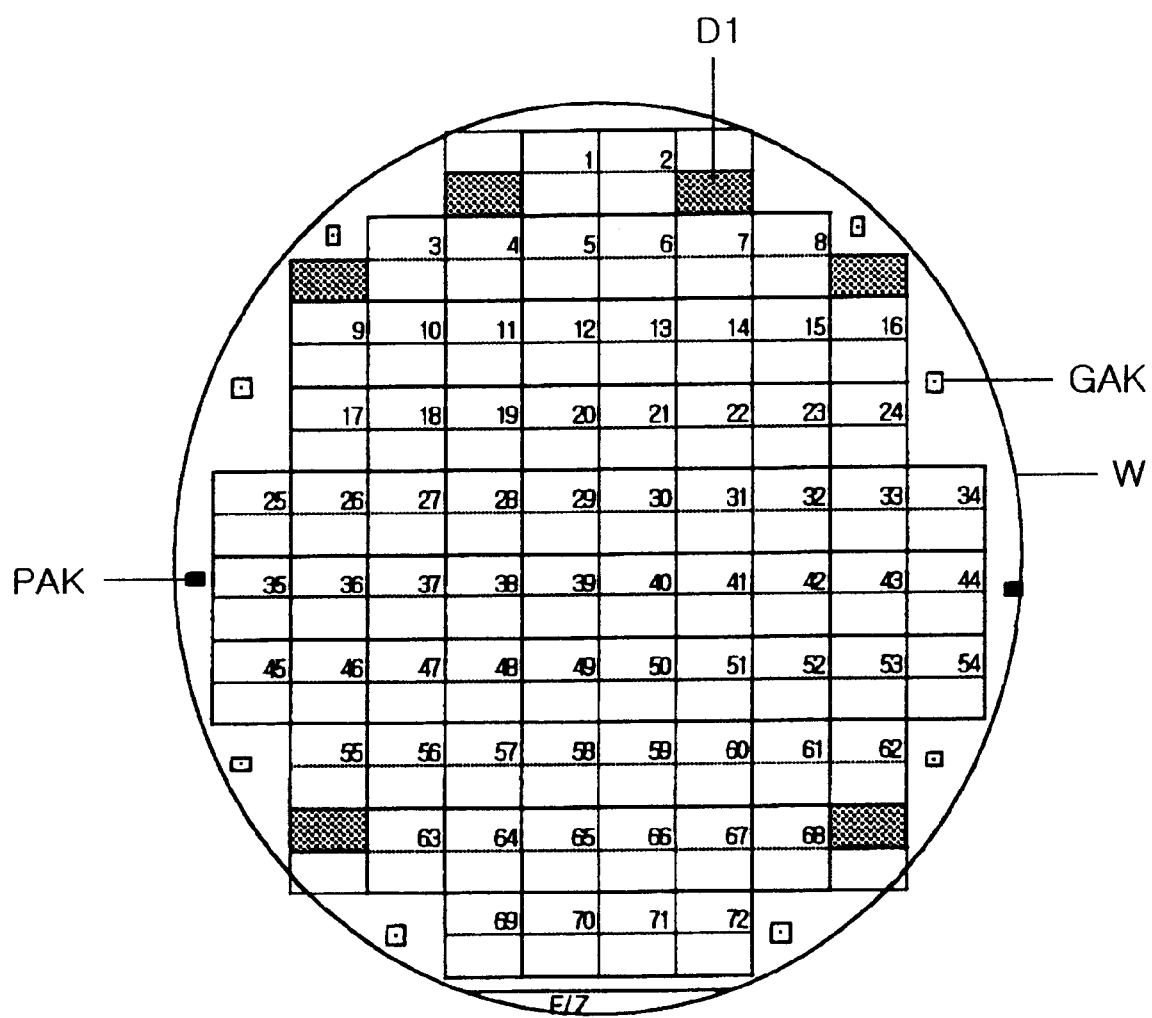
FIG. 1 shows a layout of a die and alignment key on the wafer in the conventional fabrication process of a semiconductor device.
Figure 2A:
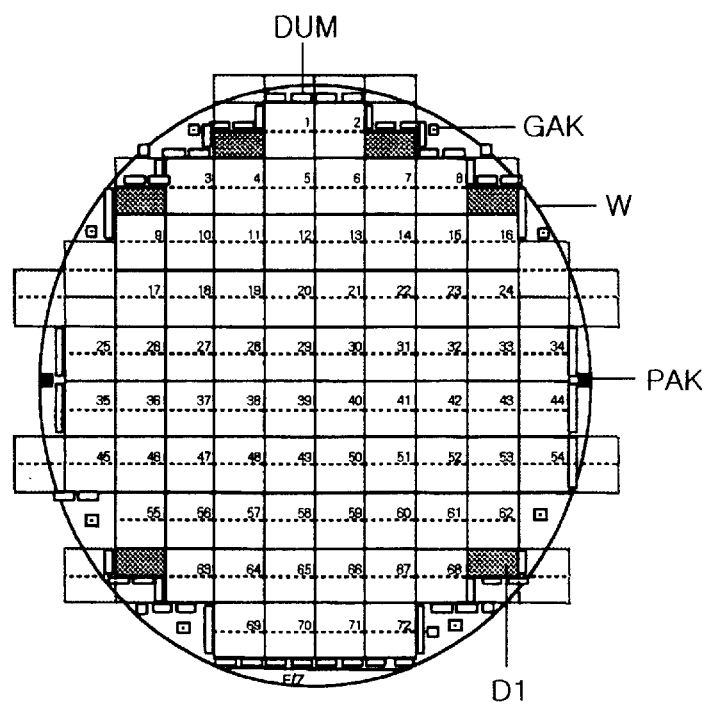
FIGS. 2A and 2B show layouts of a die, alignment key and dummy pattern on a wafer during the fabrication process of a semiconductor device in accordance with the present invention.
Figure 2B:
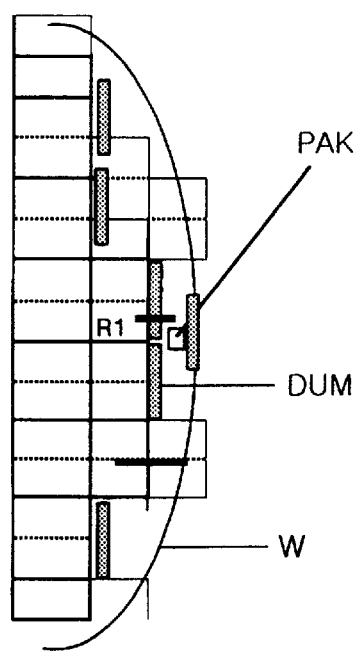

FIGS. 2A and 2B show layouts of a die, alignment key and dummy pattern on a wafer during the fabrication process of a semiconductor device in accordance with the present invention. As shown in FIGS. 2A and 2B, the dummy pattern DUM is formed to the left and right of a prealignment key PAK in the edge of the wafer W.

Figure 3:
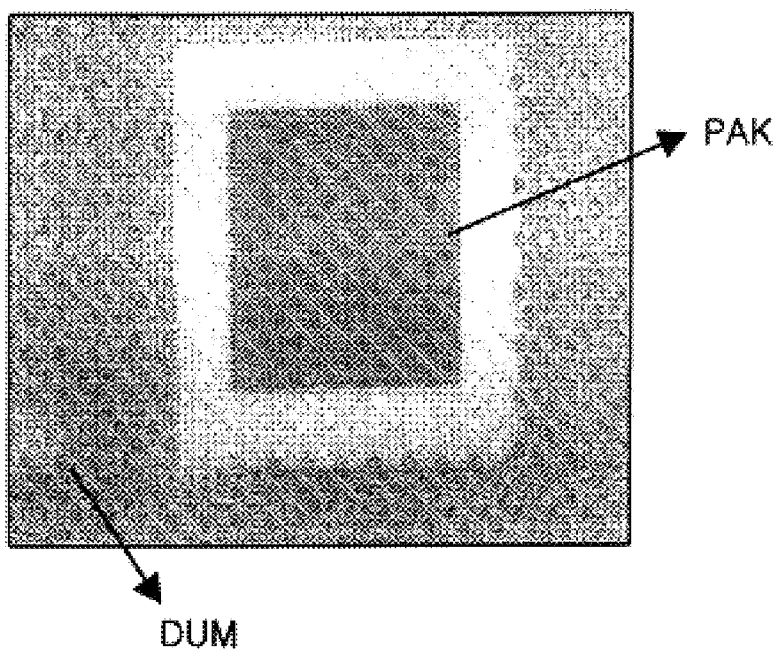
FIG. 3 is a scanning-electron-microscope (SEM) photograph in which a dummy pattern is formed around a pre-alignment key PAK, in accordance with a preferred embodiment of the present invention.

FIG. 3 is a scanning-electron-microscope (SEM) photograph in which a dummy pattern is formed around a prealignment key PAK, in accordance with a preferred embodiment of the present invention. As shown in FIG. 3, the dummy pattern is formed to enhance alignment efficiency during a masking process, which is performed after the application of the CMP process to an interlayer insulating film covering over a structure with a capacitor.

Figure 4:
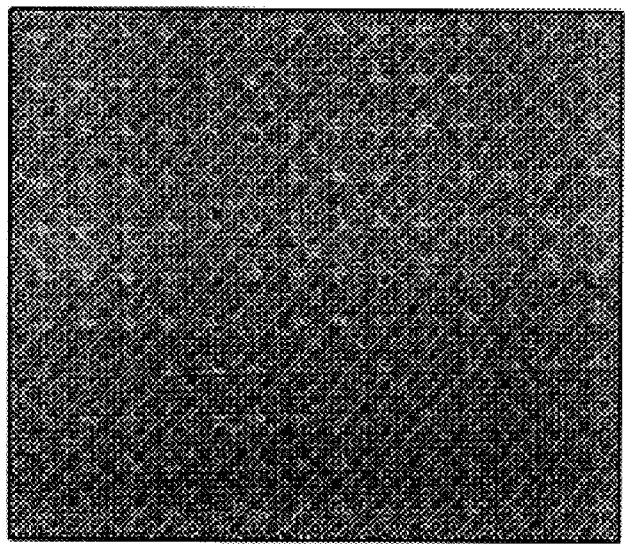
FIG. 4 is a SEM photograph showing an actual shape of the dummy pattern shown in FIG. 2B.

FIG. 4 is a SEM photograph showing an actual shape of the dummy pattern shown in FIG. 2B.

In accordance with the present invention, it is possible to protect the alignment key by disposing the dummy pattern around the alignment key with a double layer.

Figure 5A:
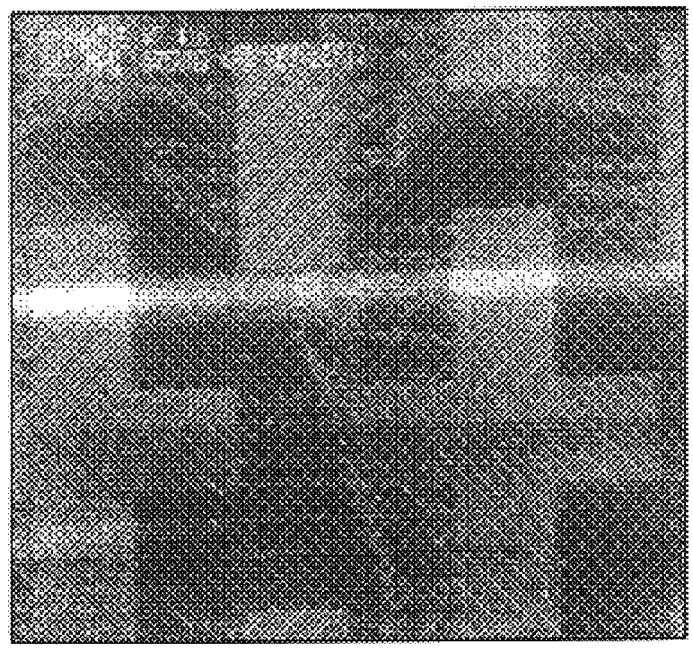
FIG. 5A is a SEM photograph showing a shape of the capacitor within a group of the dummy pattern formed around the edge of the wafer, in accordance with a preferred embodiment of the present invention.
Figure 5B:
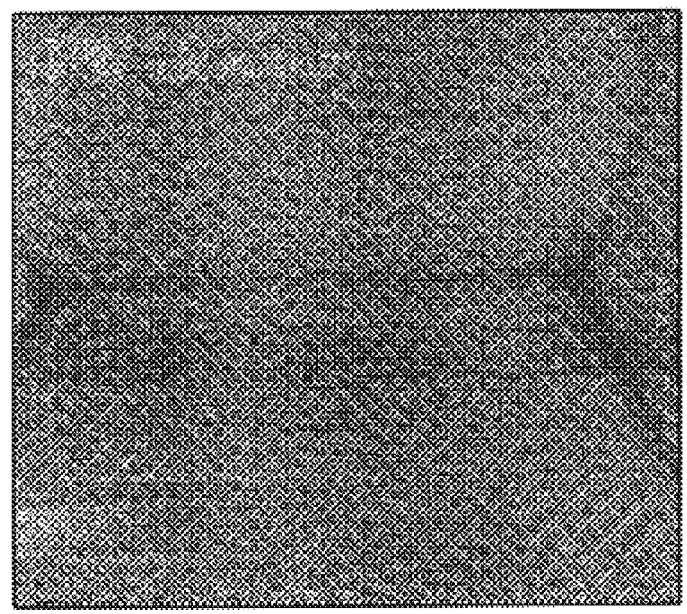
FIG. 5B is a SEM photograph showing that a convex-concave shape is formed on the surface of the capacitor by a growth of a metastable poly silicon (MPS) on the capacitor shown in FIG. 5A.

FIG. 5A is a SEM photograph showing a shape of the capacitor within a group of the dummy patterns formed around the edge of the wafer, in accordance with a preferred embodiment of the present invention. FIG. 5B is a SEM photograph showing that a convex-concave shape is formed on the surface of the capacitor by a growth of a metastable poly silicon (MPS) on the capacitor shown in FIG. 5A.

The dummy pattern previously described has the same elevation as the capacitor formed on a cell region. In addition, the dummy pattern may be formed simultaneously during the formation of the capacitor on the cell region.

As such, the present invention has the ability to form the dummy pattern around the prealignment key in the edge of the wafer, thereby decreasing a difference in pattern concentration between the central and edge portions of the wafer, and decentralizing a pad pressure using the dummy pattern. Accordingly, the present invention prevents an excessive chemical-mechanical polishing process from being applied to the edge portion of the wafer.

As mentioned above, the present invention disposes a dummy pattern around a die and alignment key of edges of a wafer to thereby decrease a difference in pattern concentration between the central and edge portions of the wafer. Furthermore, the present invention decentralizes a pad pressure using the dummy pattern during polishing processes to allow the pad pressure to be applied to the dummy pattern, thereby preventing an unreasonable CMP from being applied to dies placed adjacent to the edge of the wafer and preventing a dishing of the alignment key. The result is an increased net die, improved accuracy and reduced misalignment. That is to say, the present invention allows the dummy pattern to have the same elevation as the capacitor formed on the cell region, to thereby effectively avoid an excessive polishing from being applied to the edge of the wafer, during the application of the CMP process to an interlayer insulating film covering over a structure with a capacitor.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for the fabrication of a semiconductor device having a cell region on which a capacitor is formed, comprising steps of:
   (a) forming a group of dummy patterns around an alignment key of edges of a wafer, wherein the wafer is obtained by forming the capacitor on the cell region, and the dummy pattern has a same elevation as the capacitor formed on the cell region;
   (b) disposing an interlayer insulating film on a resulting structure obtained after said step (a); and
   (c) performing a chemical-mechanical polishing on the interlayer insulating film.

2. A method for the fabrication of a semiconductor device having a cell region on which a capacitor is formed, comprising steps of:
   (a) forming a group of dummy patterns around an alignment key of edges of a wafer while forming the capacitor on the cell region, wherein the dummy pattern has a same elevation as the capacitor formed on the cell region;
   (b) disposing an interlayer insulating film on a resulting structure obtained after said step (a); and
   (c) performing a chemical-mechanical polishing on the interlayer insulating film.

3. The method of claim 1, wherein the group of the dummy patterns includes a bar pattern.

4. The method of claim 3, wherein the dummy pattern includes a metastable poly silicon (MPS) with a surface having a convex-concave shape.

5. The method of claim 2, wherein the group of the dummy patterns includes a bar pattern.

6. The method of claim 5, wherein the dummy pattern includes a metastable poly silicon (MPS) with a surface having a convex-concave shape.

* * * * *